United States Patent [19]

Conrad

[11] 4,358,173

[45] Nov. 9, 1982

[54] ELECTRICAL CONNECTOR FOR LEADLESS INTEGRATED CIRCUIT PACKAGES

[75] Inventor: Richard A. Conrad, Vista, Calif.

[73] Assignee: Teledyne Industries, Inc., Los Angeles, Calif.

[21] Appl. No.: 176,538

[22] Filed: Aug. 8, 1980

[51] Int. Cl.³ .............................................. H01R 9/09
[52] U.S. Cl. .................................. 339/17 CF; 339/174
[58] Field of Search ........... 339/17 CF, 17 F, 17 LM, 339/17 M, 174, 75 M; 174/52 FP

[56] References Cited

U.S. PATENT DOCUMENTS

| | | | |
|---|---|---|---|
| 3,629,787 | 12/1971 | Wilson | 339/17 F |
| 3,631,380 | 12/1971 | Bohn | 339/17 M X |
| 3,771,100 | 11/1973 | Reed | 339/17 LM |
| 3,874,768 | 4/1975 | Cutchaw | 339/75 M X |
| 4,176,895 | 12/1979 | Aldridge | 339/174 X |

Primary Examiner—Eugene F. Desmond
Attorney, Agent, or Firm—Reagin & King

[57] ABSTRACT

An electrical connector for effecting connection to leadless integrated circuit packages without the use of printed circuit boards is disclosed. A first embodiment is used to provide electrical connection from electrically conductive pads on one package to the respective pads on another package by means of a series of resilient electrically conductive contacts supported in a generally T-shaped dielectric body which is inserted between adjacent packages. A second embodiment is also disclosed which may be used to connect a leadless integrated circuit package to a multiconductor cable without the use of printed circuit boards.

3 Claims, 8 Drawing Figures

ELECTRICAL CONNECTOR FOR LEADLESS INTEGRATED CIRCUIT PACKAGES

BACKGROUND OF THE INVENTION

This invention relates to electrical connectors and, more particularly, to an electrical connector for making electrical connections to leadless integrated circuit packages.

There is an electronic component known as a leadless integrated circuit package which is used to house large scale integrated circuit devices. This type of package is characterized by having a plurality of conductive areas or pads which are equally spaced along the upper surface on one or more sides of the package. Many prior art electrical connectors have been devised for electrically connecting these types of packages to a printed circuit board located beneath the package. The printed circuit board is then used to provide the interconnections between the various packages and also to provide connections to the packages from input and output cables.

In many instances a leadless integrated circuit package is used to house a plurality of integrated circuit devices. For example, integrated circuits which perform the functions of a central processor, a digital memory, and input/output logic may all be housed in a single leadless package as part of a microprocessor system. However, high levels of power dissipation are encountered when several integrated circuits are operating within a single package.

The use of a printed circuit board as the mounting surface results in inadequate cooling due to poor thermal conductivity. To provide adequate cooling, it has been found desirable to directly mount these leadless packages to a metal surface which acts as a heat sink.

The use of a metal mounting surface necessitates a means for making electrical connections to the leadless integrated circuit packages which, unlike the prior art connectors, does not require a printed circuit board.

Accordingly, it is an object of the present invention to provide a new and improved electrical connector for leadless integrated circuit packages.

It is another object of the present invention to provide a connector for electrically interconnecting leadless integrated circuit packages without the use of a printed circuit board.

It is a further object of the invention to provide a connector for electrically connecting leadless integrated circuit packages to input and output cables without the use of a printed circuit board.

SUMMARY OF THE INVENTION

The foregoing and other objects of the invention are accomplished by a connector which includes a dielectric body having a flat top surface and a center leg depending therefrom, forming a generally T-shaped cross section. A series of parallel spaced apart resilient electrically conductive contacts are mounted through the center leg below and parallel to the top surface, with opposite sides of the contacts projecting from opposite sides of the center leg. In a first embodiment of the connector, the opposite sides of each contact are bent downward and toward the center leg in a generally C-shaped form, symmetrically straddling the center leg. Thus, the free ends of the contacts lie essentially parallel to the top surface of the block on each side of the center leg.

A series of parallel spaced apart ribs extend downward from the flat top surface along both sides of the center leg. The ribs are positioned between adjacent conductive contacts and form a series of cavities for containing each contact. The ribs serve to electrically insulate and to maintain the alignment of the contacts. The free ends of the contacts extend below the bottom surfaces of the ribs. Depending from the center leg, threaded studs are provided for mounting the connector.

The first embodiment of the connector is used to electrically interconnect two leadless integrated circuit packages in the following manner. The leadless packages are aligned on a mounting surface with their conductive pads facing each other. The packages are spaced apart a distance sufficient to clear the width of the center leg of the connector. The connector is then inserted from above with the center leg between the two packages so that the free ends of the contacts contact the conductive pads of the packages. Clearance holes are provided in the mounting surface to permit the threaded studs of the connector to pass therethrough, and nuts are fastened to the studs from the underside of the mounting surface. By tightening these nuts, the free ends of the connector contacts are forced down onto the respective pads of the two packages. The connector is fully installed when the bottom surface of the center leg is drawn into contact with the mounting surface. The C-shape of the resilient contacts provides a downward spring force on the contact ends, insuring positive connection to the pads of the packages.

Thus each contact of the connector provides electrical connection from a pad on one package to a respective pad on the other package. The spring force of the contacts also serves to hold the packages down onto the mounting surface. A plurality of leadless packages may be interconnected in serial fashion as described above, without the need for a printed circuit board.

A second embodiment of the connector is provided to electrically connect a leadless integrated circuit package to an input or output cable. This second embodiment is substantially identical to the first embodiment except for the form of the resilient electrically conductive contacts. In the second embodiment, only one side of each contact is bent into the C-shaped form described in the first embodiment. The other side of each contact is not bent so that it remains parallel to the top surface of the connector. The free ends of the unbent sides of the contacts form terminals which project outward from between the connector ribs and lie in a horizontal plane.

Each conductor of a multiconductor cable such as a flat ribbon cable is connected to the free end of the unbent side of each contact of the connector by means such as soldering. The connector is then installed adjacent to the end of a leadless package. The C-shaped side of each connector contact contacts a respective conductive pad on the package in a manner identical to that described in the first embodiment.

Thus the second embodiment of the connector provides electrical connection between the conductors of an input or output cable and the pads of a leadless package without the need for a printed circuit board.

Other objects, features, and advantages of the invention will become apparent from a reading of the specification when taken in conjunction with the drawings in which like reference numerals refer to like elements in the several views.

DESCRIPTION OF THE PREFERRED EMBODIMENT

Figure 1:
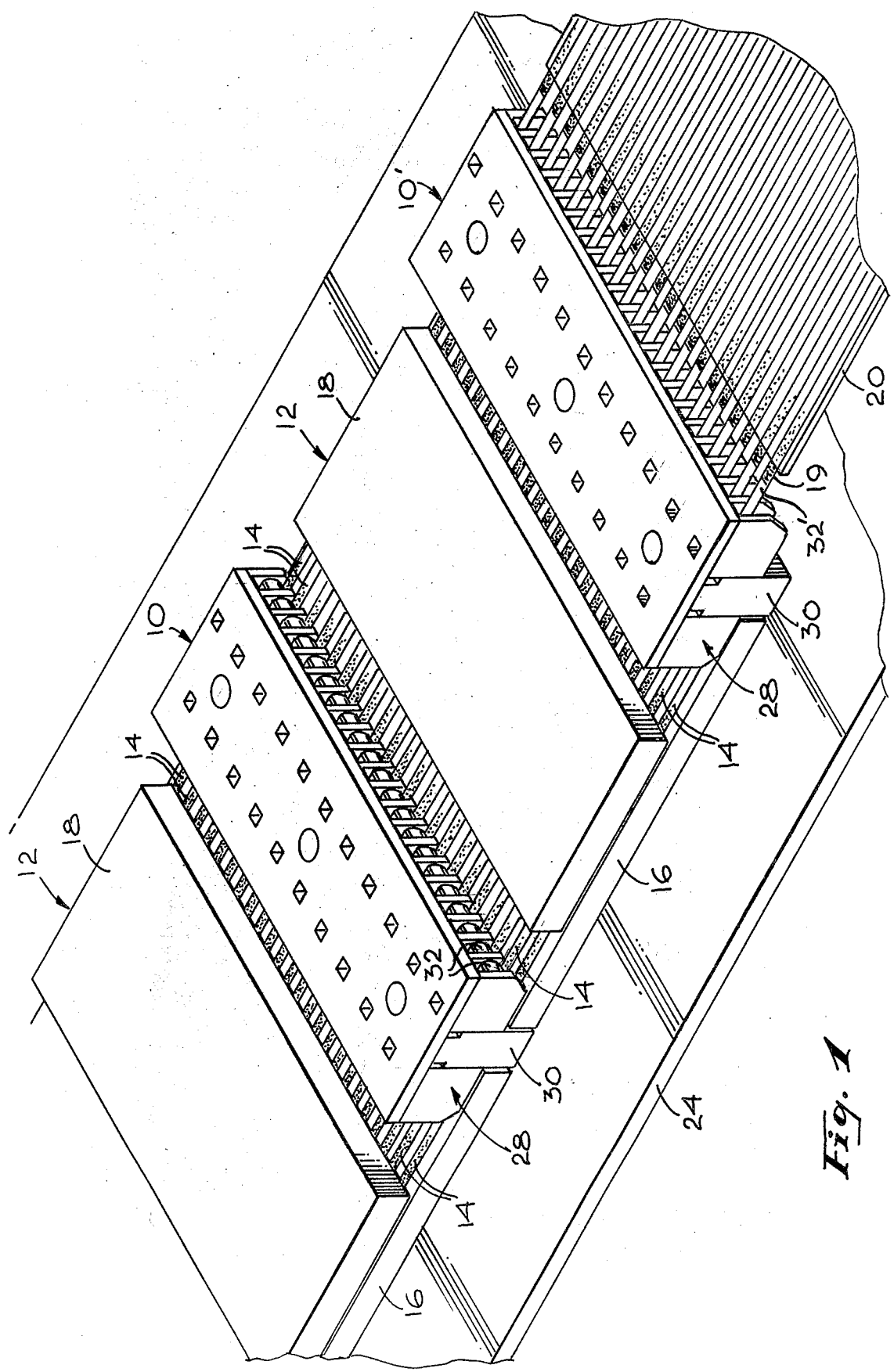
FIG. 1 is a perspective view showing a circuit assembly employing the electrical connectors made according to the present invention.

Referring now to FIG. 1, there is shown a circuit assembly which employs a first embodiment 10 and a second embodiment 10' of the electrical connectors made according to the present invention. The first embodiment 10 of the electrical connector is in the form of a T-shaped bar which is mounted between two leadless integrated circuit packages 12, as shown in FIG. 1. The electrical connector 10 serves the function of interconnecting the electrically conductive pads 14 of one leadless package 12 to the corresponding electrically conductive pads 14 of a second leadless package 12 by means of resilient electrically conductive contacts 32 mounted within the connector 10. The typical leadless integrated circuit package 12 includes a base or substrate 16 which is made of a ceramic material such as aluminum oxide or beryllium oxide. The substrate 16 is provided with metallized pads 14 which are equally spaced along the upper surface of the substrate 16. The leadless package 12 also includes a cover 18 used to protect the integrated circuit devices located within.

The second embodiment 10' of the connector is used to connect a leadless package 12 to an input or output cable leading to external circuitry. This arrangement is shown in the lower right portion of FIG. 1. Each conductor 19 of a flat ribbon cable 20 is connected to one end of an electrically conductive contact 32' of the connector 10' by means such as soldering. When the connector 10', which has the same T-shaped form as the connector 10, is installed in the position shown in FIG. 1 the other ends of the contacts 32' contact the metallized pads 14 of the leadless package 12 as described hereinafter. With this configuration a leadless package 12 may be electrically connected to an input or output cable 20. The leadless packages 12 and the connectors 10 and 10' are all mounted to a flat mounting surface 24 which may be a sheet of aluminum or other metal which acts as a sink for the packages 12.

In addition to providing a connecting means for the leadless packages 12, the connectors 10 and 10' also serve to retain the packages 12 in contact with the mounting surface 24. This retaining force is a result of the resilient electrically conductive contacts 32 and 32' used in the connectors 10 and 10' and described hereinafter. If additional support is desired, the substrates 16 of the packages 12 may be attached to the mounting surface 24 using a suitable adhesive.

Figure 2:
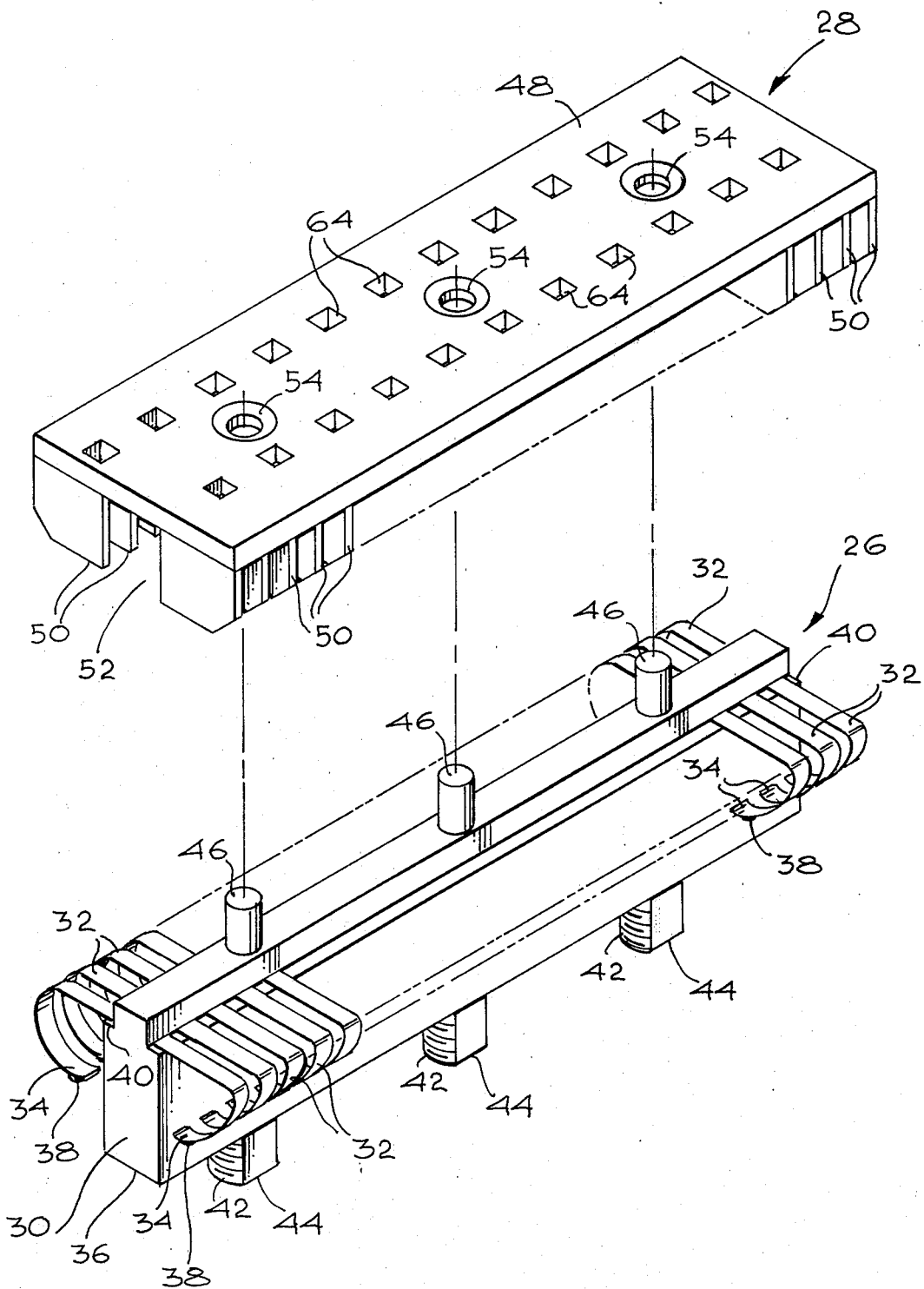
FIG. 2 is a perspective exploded view of the first embodiment of the electrical connector of the present invention.

Referring now to FIG. 2, there is shown a perspective exploded view of the first embodiment 10 of the electrical connector of the present invention. In the preferred embodiments the connector is constructed in two parts, a lower portion 26 and an upper portion 28. The lower portion 26 of the connector 10 includes a bar-shaped body 30 formed of a dielectric material. Mounted in the body 30 are a series of parallel spaced apart resilient electrically conductive contacts 32. The contacts 32 may be formed of a metal such as a copper alloy and may be of various shapes. In the preferred embodiment they are formed of a flat conductive ribbon.

The central portion of each conductive contact 32 is embedded within the body 30 by means such as insert molding. The opposite sides of the contact 32 are bent downward in a generally C-shaped form symmetrically straddling the body 30. The result of this bend is that the free ends 34 of the contacts 32 are oriented in a plane parallel to the bottom surface 36 of the body 30. As described hereinafter, the bottom surface 36 of the body 30 serves as the mounting surface of the connector 10. The free ends 34 of the contacts 32 are designed to contact the electrically conductive pads 14 of the leadless packages 12 as shown in FIG. 1. The free ends 34 of the contacts 32 may have formed thereon contact points 38. The contact points 38 are relatively sharp and assist in making conductive contact to the pads 14 of the leadless packages 12.

As shown in FIG. 2, the contacts 32 are evenly spaced apart along the length of the body 30. The spacing of the contacts 32 is dictated by the corresponding spacing of the electrically conductive pads 14 of the leadless packages 12. A step 40 is provided on either side of the upper end of the body 30. The step 40 provides clearance above the conductive contacts 32 to permit the contacts 32 to flex without interference when the assembled connector 10 is installed.

Threaded mounting studs 42 are located at suitably spaced apart intervals along the length of the body 30, depending from the bottom surface 36 thereof. The threaded studs 42 are used to fasten the connector 10 to the mounting surface 24, as described hereinafter. In the preferred embodiment the threaded studs 42 are formed with flatted sides 44. The flatted sides 44 permit the use of a large thread diameter for strength yet maintain the width of the stud 42 equal to the width of the body 30. As shown in FIG. 1, the width of the body 30 determines the spacing between adjacent leadless packages 12. Thus it is desirable to minimize the width of the body 30 to achieve a high package density. Cylindrical studs 46 are also provided at intervals along the top surface of the body 30. These cylindrical studs 46 are used to fasten the upper member 28 to the lower member 26 of the connector 10.

Referring now to the upper member 28 of the connector 10 as shown in FIG. 2, there is shown a block formed of a dielectric material and having a flat top 48. Depending from the top 48 are a series of parallel spaced apart ribs 50 positioned along the length of the upper member 28. A row of the spaced apart ribs 50 is provided along each side of the upper member 28. The ribs 50 are spaced apart at a distance which permits them to fit between the parallel conductive contacts 32 when the connector 10 is assembled. A clearance channel 52 is provided between the two rows of ribs 50 of the upper member 28 to accommodate the body 30 of the lower member 26 when the connector 10 is assembled. Also provided on the upper member 28 are countersunk clearance holes 54 to mate with the studs 46 of the lower member 26.

The connector 10 is assembled by fitting the upper member 28 over the lower member 26. When the parts are properly engaged, the ribs 50 are positioned between each of the adjacent conductive contacts 32 and the studs 46 protrude through the clearance holes 54. The substantially D-shaped ribs 50 serve as electrical barriers between adjacent contacts 32. The ribs 50 also serve to maintain the proper alignment and spacing for the contacts 32 during subsequent handling and installation of the connector 10. Proper spacing of the contacts 32 is necessary to ensure reliable contact with the electrically conductive pads 14 of the leadless packages 12. The assembled connector 10 has the generally T-shaped cross section shown in FIG. 1. The upper member 28 is held to the lower member 26 by heat staking or swaging the top surface of the cylindrical studs 46 into the countersunk portion of the clearance holes 54 in the upper member 28. This is shown more clearly at 56 in FIG. 4. The upper member 28 and the body 30 of the lower member 26 may be constructed of a moldable thermoplastic such as Ryton R-4. The contacts 32 may be insert molded into the body 30 in the form of flat horizontal strips of a copper alloy such as beryllium copper. After molding, the contacts 32 are then bent into their C-shaped form by means well known to those skilled in the art. The contact points 38 in the contacts 32 are also formed at this time.

Figure 3:
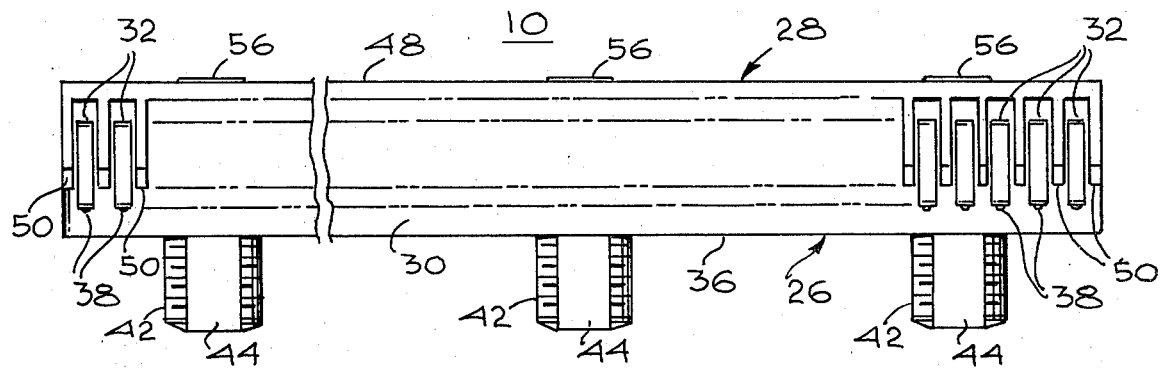
FIG. 3 is a side plan view of the electrical connector of the present invention as shown in FIG. 2.

Referring now to FIG. 3, there is shown a side view of the electrical connector 10, illustrating the ribs 50 interdigitated between the conductive contacts 32. FIG. 3 also illustrates the fact that the connector 10 may be manufactured in a variety of different lengths corresponding to the desired number of contacts 32. Thus the connector 10 can be made to accommodate a variety of different sizes of leadless packages 12.

Figure 4:
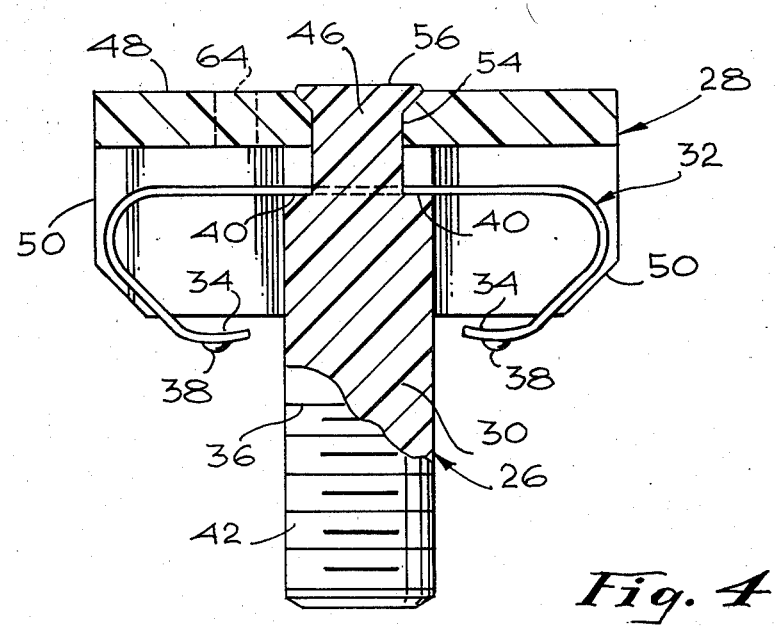
FIG. 4 is an end cross-sectional view of the connector shown in FIG. 2.

FIG. 4 is an end cross-sectional view of the connector 10, illustrating the unstressed position of the conductive contact 32. It can be seen that the step 40 in the body 30 provides clearance above the contact 32 in the assembled connector 10. It can also be seen that the C-shaped bends in the contact 32 are designed to permit the free ends 34 of the contact 32 to be positioned below the bottom surface of the ribs 50.

Figure 5:
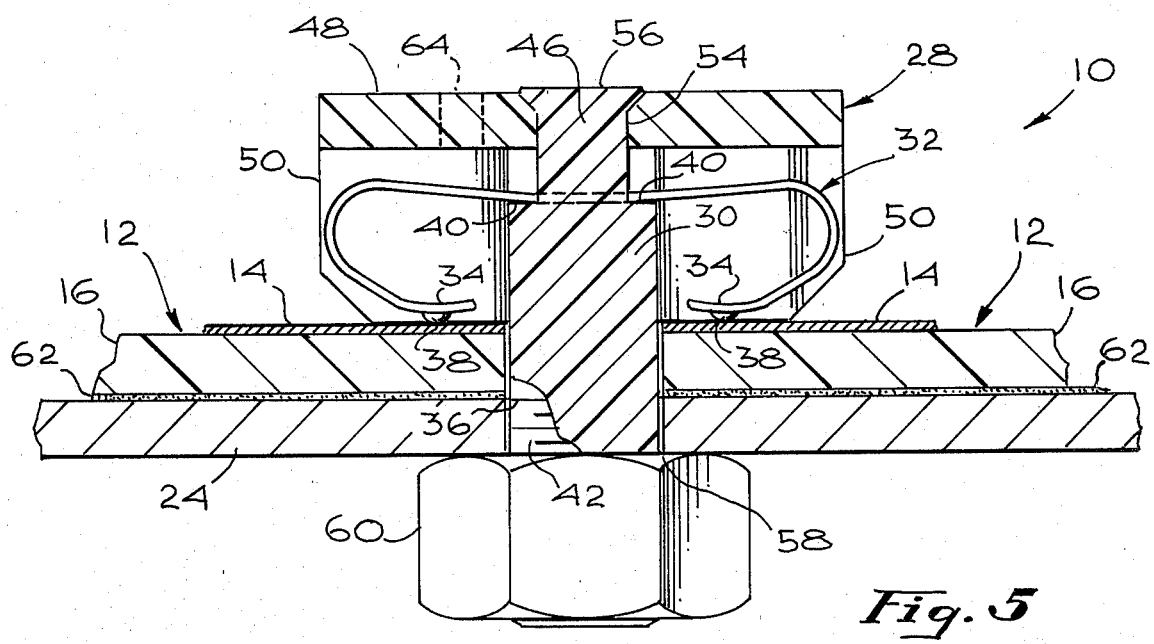
FIG. 5 is an end cross-sectional view of the first embodiment of the connector showing the position of the leadless packages and also showing the attachment of the connector to the mounting surface.

FIG. 5 is another end cross-sectional view showing the connector 10 installed between two leadless packages 12. The connector body portion 30 is inserted between two adjacent substrates 16 of the leadless packages 12. The bottom surface 36 of the body portion 30 rests on the mounting surface 24 while the threaded studs 42 pass through clearance holes 58 in the mounting surface 24. The connector 10 is held in this position by a retaining nut 60 fastened to each threaded stud 42. As shown in FIG. 5, when the connector 10 is fastened down to the mounting surface 24, the resilient electrical contacts 32 make contact to the metallized electrically conductive pads 14 located on the substrates 16 of the leadless packages 12. The contact points 38 formed on the free ends 34 of the contacts 32 serve to provide a reliable high pressure contact to the pads 14.

As can be seen by comparing FIGS. 4 and 5, the unstressed positions of the free ends 34 of the contacts 32 are such that the distance between the free ends 34 and the bottom surface 36 of the connector 10 is less than the distance between the conductive pads 14 of the leadless package 12 and the mounting surface 24. Thus, when the connector 10 is fastened to the mounting surface 24, the free ends 34 of the contacts 32 are caused to press down onto the pads 14 of the substrate 16. In turn, the resilient contacts 32 bend upward into the clearance area provided by the step 40. The spring forces thus exerted on the substrate 16 by the resilient contacts 32 act to hold the substrate 16 in contact with the mounting plate or heat sink 24. An optional layer of adhesive 62 may be used to further fasten the substrate 16 to the heat sink 24. FIG. 5 also illustrates that the shape and size of the barrier 50 is such that the contact 32 is contained within the outline of the barrier 50 protecting the contact 32 from accidental damage or electrical shorting during installation.

Another feature of the connector 10 is the provision of test probe access holes 64, as shown in FIG. 2. These test probe access holes 64 are in the form of square apertures within the top 48 of the upper member 28. The holes 64 are positioned in a staggered arrangement so that a square aperture is located between adjacent ribs in a position directly above each electrical contact 32. This position can be more clearly seen in FIGS. 4 and 5. The access holes 64 permit a test probe to be inserted through the top 48 of the connector 10 into contact with the contacts 32 while the connector is in place. This feature permits the user to make test measurements without having to remove the connector 10.

The configuration of the connector 10 described above permits interconnecting leadless integrated circuit packages 12 without the use of printed circuit boards. Additionally, the T-shaped design with a thin body 30 permits high density packaging to be achieved. For example, the width of the body 30 in a typical connector is only one-tenth of an inch, allowing very close spacing of adjacent leadless packages 12.

Figure 6:
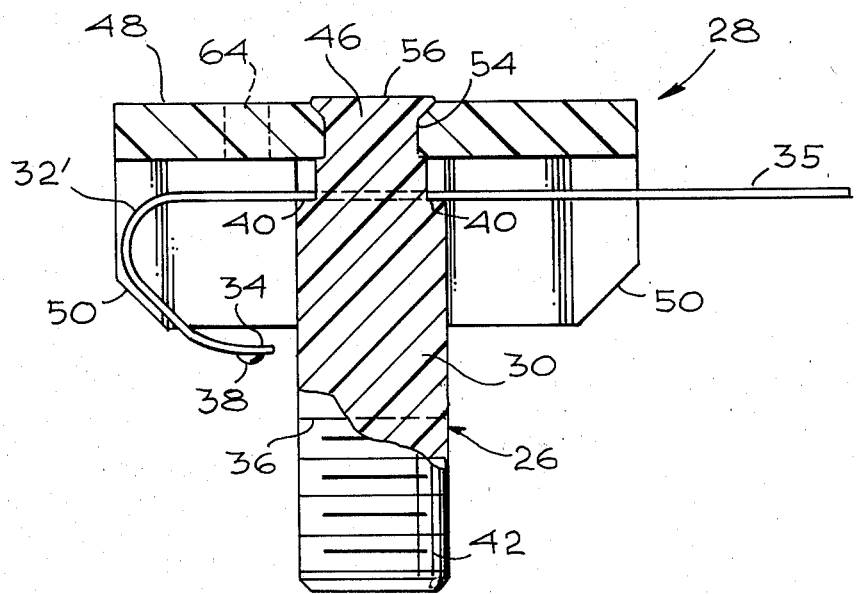
FIG. 6 is an end cross-sectional view of the second embodiment of the connector made according to the present invention.

FIG. 6 is an end cross-sectional view of the second embodiment 10' of the connector of the present invention. The electrical connector 10' serves the function of connecting the electrically conductive pads 14 of a leadless package 12 to the conductors 19 of an input or output cable 20 as shown in FIG. 1. With one exception the configuration and method of assembly of the connector 10' is identical to the configuration and method of assembly of the connector 10 as described above and in FIGS. 2 and 3.

Comparing FIG. 6 to FIG. 4 it can be seen that the shape of the resilient electrically conductive contacts 32' of the connector 10' differs from the shape of the contacts 32 of the connector 10. As shown in FIG. 6, only one side of the contact 32' of the connector 10' is bent into the C-shaped form described above for the connector 10. The other side of each of the contacts 32' remains unbent. Thus the free end on one side of each of the contacts 32' projects outward from between the ribs 50, forming a terminal 35 which lies in a horizontal plane as shown in FIG. 6.

Figure 7:
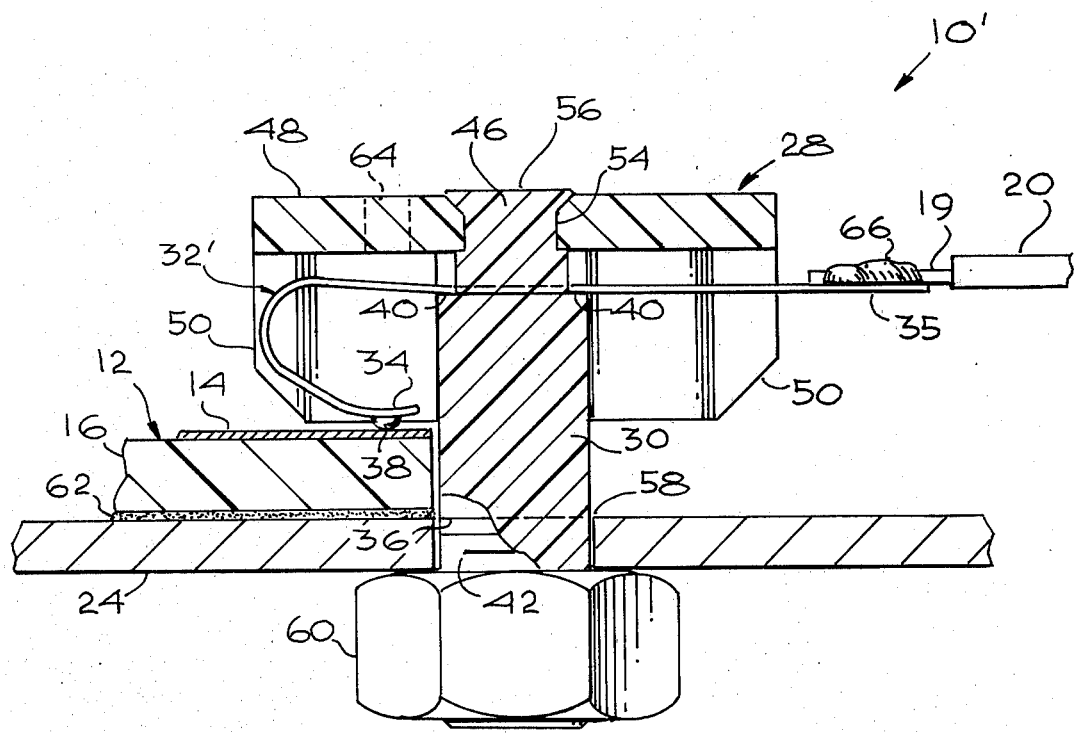
FIG. 7 is an end cross-sectional view of the installed connector of FIG. 6 showing the attachment of a ribbon cable.

FIG. 7 shows how the connector 10' is used to electrically connect a ribbon cable 20 to a leadless package 12. Each conductor 19 of the multiconductor cable 20 is connected to the terminal end 35 of each of the contacts 32' of the connector 10' by means such as solder 66. The connector 10' is then installed adjacent the edge of the leadless package 12 in the manner shown in FIG. 7. Thus the free end 34 of the C-shaped side of each of the contacts 32' of the connector 10' contacts the respective pads 14 on the substrate 16 of the leadless package 12. This method of contact to the package 12 and the installation of the connector 10' is identical to that described above and shown in FIG. 5 for the connector 10.

Accordingly, the configuration of the connector 10' described above permits connecting leadless integrated circuit packages to input and output cables 20 without the use of printed circuit boards. In addition, the connector 10' may be constructed using the same parts and methods as the connector 10. The only change required is in the design of the tool used to form the contact 32'.

The connectors 10 and 10' thus described are designed to provide connections to leadless integrated circuit packages without the requirement for a printed circuit board. It should be noted, however, that the design of the connectors 10 and 10' does not preclude the use of such printed circuit boards if desired. For example, a printed circuit board having conductive pads along one edge could be substituted for one of the leadless packages 12 in FIG. 5.

Figure 8:
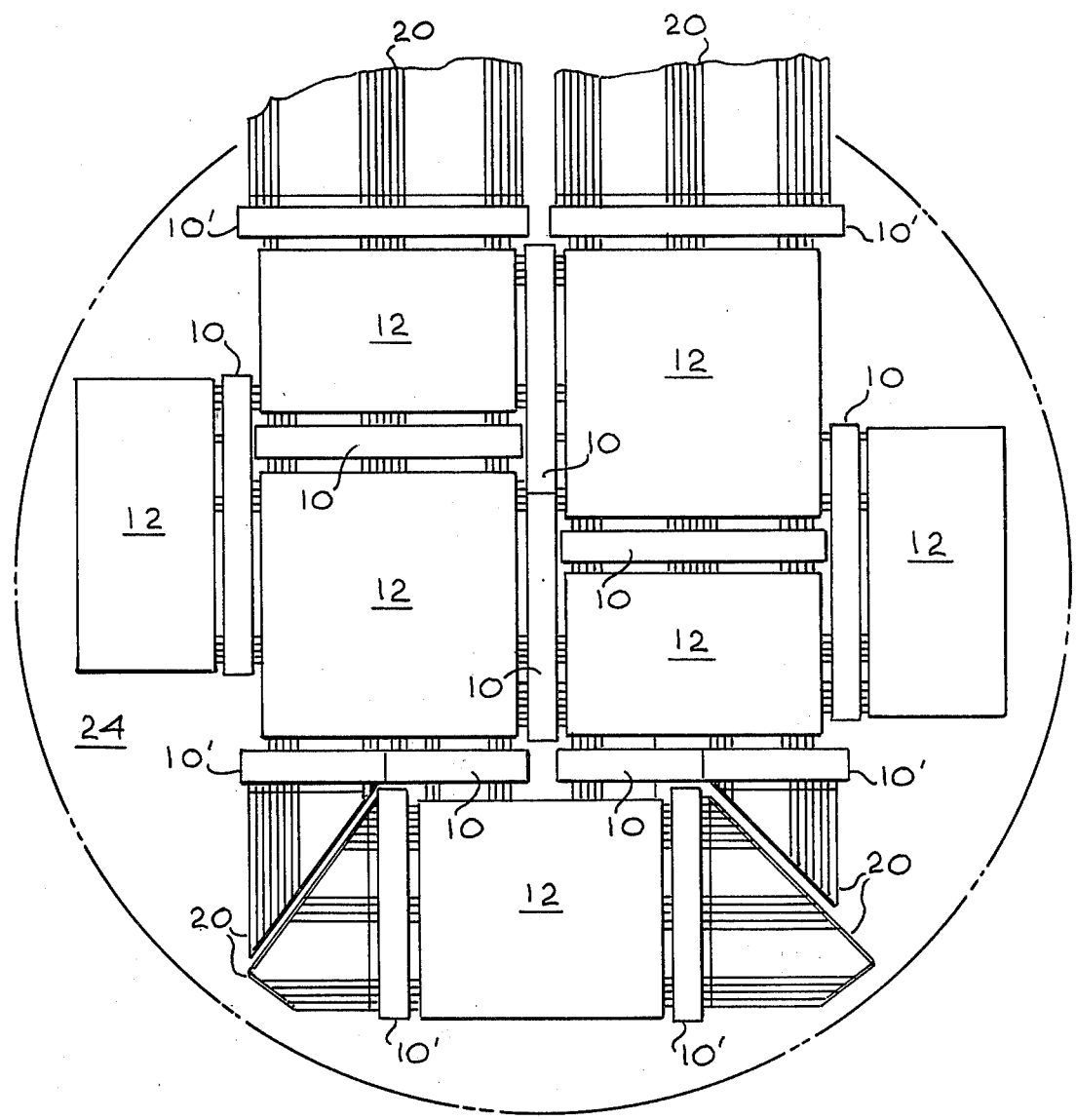
FIG. 8 is a top view showing another circuit assembly employing a plurality of the electrical connectors made according to the present invention.

FIG. 8 illustrates the high density packaging and the heat sinking of leadless packages 12 made possible by using the connectors 10 and 10' of the present invention. FIG. 8 shows the interconnection of seven leadless integrated circuit packages 21 which comprise a military version of a microcomputer. Several of the leadless packages 12 have electrically conducting pads 14 on all four sides of the package. Also shown in FIG. 8 are connections to ribbon cables 20 for input and output of electrical signals and power. All of the leadless packages 12 and the connectors 10 and 10' are mounted to a common aluminum heat sink surface 24 and no printed circuit boards are required.

While there has been shown and described a preferred embodiment, it is to be understood that various other adaptations and modifications may be made within the spirit and scope of the invention. It is thus intended that the invention be limited in scope only by the appended claims.

What is claimed is:

1. A connector for making electrical connections to leadless integrated circuit packages comprising:
    a bar shaped body member having a planar bottom surface;
    means for fastening the bottom surface of the body member to a mounting surface;
    a plurality of resilient electrically conductive contacts, each having a central portion and a first and a second free end;
    means for attaching the central portion of each of the contacts to the body member in a plane lying above the bottom surface of the body member, each contact being parallel spaced apart from the adjacent contact along the length of the body member with the free ends of each contact projecting from the respective sides of the body member;
    means for positioning the first free end of each of the contacts so that the distance between the first free end and the bottom surface of the body member of the connector is less than the distance between the conductive pads of the leadless integrated circuit package and the mounting surface of that package;
    a flat top section mounted across the top of the body member in a plane lying above the conductive contacts, and parallel to the bottom surface of and extending the length of the body member; and
    a plurality of parallel spaced apart ribs depending from each side of the top section, each rib being positioned between adjacent contacts whereby the ribs serve as electrically insulating barriers between contacts as well as maintaining the alignment of the contacts.

2. The connector of claim 1 in which the flat top section of the barrier member further includes a plurality of apertures, each aperture located directly above one conductive contact, whereby a test probe may be inserted through the aperture in the top section to make electrical contact to the conductive contact.

3. A connector for making electrical connections to leadless integrated circuit packages comprising:
    a bar shaped body member having a planar bottom surface;
    means for fastening the bottom surface of the body member to a mounting surface;
    a plurality of resilient electrically conductive contacts, each having a central portion and a first and a second free end;
    means for attaching the central portion of each of the contacts to the body member in a plane lying above the bottom surface of the body member, each contact being parallel spaced apart from the adjacent contact along the length of the body member with the free ends of each contact projecting from the respective sides of the body member;
    means for positioning the first free end of each of the contacts so that the distance between the first free end and the bottom surface of the body member of the connector is less than the distance between the conductive pads of the leadless integrated circuit package and the mounting surface of that package;
    means for positioning the second free end of each of the contacts including bending the ends of each contact downward and toward the body member in a generally C-shaped form that straddles the body member so that the distance between the second free end and the bottom surface of the body member is less than the distance between the conductive pads of the leadless integrated circuit package and the mounting surface of that package, whereby when the bottom surfaces of the body member of the connector and the leadless integrated circuit packages are mounted on a common mounting surface with the body member of the connector between adjacent leadless packages, the free ends of the resilient electrically conductive contacts will be forced into contact with the conductive pads of the leadless packages, electrically interconnecting the packages as well as retaining the leadless packages in contact with the mounting surface.

* * * * *